(12) United States Patent
Wang

(10) Patent No.: US 11,985,769 B2
(45) Date of Patent: May 14, 2024

(54) PUSH-TO-OPEN LID AND CONTAINER

(71) Applicant: BlackBerry Limited, Waterloo (CA)

(72) Inventor: Enliang Wang, Kitchener (CA)

(73) Assignee: BlackBerry Limited, Waterloo (CA)

( * ) Notice: Subject to any disclaimer, the term of this patent is extended or adjusted under 35 U.S.C. 154(b) by 201 days.

(21) Appl. No.: 17/516,020

(22) Filed: Nov. 1, 2021

(65) Prior Publication Data

US 2023/0136400 A1 May 4, 2023

(51) Int. Cl.
*H05K 5/00* (2006.01)

(52) U.S. Cl.
CPC . *H05K 5/0013* (2013.01); *B65D 2543/00194* (2013.01); *B65D 2543/0037* (2013.01); *B65D 2543/00518* (2013.01); *B65D 2543/00546* (2013.01); *B65D 2543/00574* (2013.01); *B65D 2543/00935* (2013.01)

(58) Field of Classification Search
CPC .......... H05K 5/0013; B65D 2543/0037; B65D 90/56; B65D 2543/00287; B65D 43/0204; B65D 43/021; B65D 2543/00611; B65D 2543/00703; B65D 2543/00694
USPC ................................................. 220/305, 350
See application file for complete search history.

(56) References Cited

U.S. PATENT DOCUMENTS

| 982,436 A | 1/1911 | Maggiorani |
| 3,360,161 A | 12/1967 | Smith |
| 4,090,636 A | 5/1978 | Norton |
| 2011/0222212 A1 | 9/2011 | Xiao |
| 2013/0327770 A1* | 12/2013 | Turvey ................. B65D 43/021 220/787 |

FOREIGN PATENT DOCUMENTS

| GB | 190202498 A | 1/1903 |
| GB | 704190 A | 2/1954 |
| JP | 86092959 U | 6/1985 |
| KR | 100656399 B1 | 12/2006 |

OTHER PUBLICATIONS

Extended European Search Report, EP Application No. 22204295, dated Mar. 13, 2023, pp. 1-21.
Canadian Intellectual Property Office (CIPO) Official Action and Examination Search Report for Application No. 3,173,573 dated Nov. 23, 2023, 4 pages.

* cited by examiner

*Primary Examiner* — Jeffrey R Allen
(74) *Attorney, Agent, or Firm* — Moffat & Co

(57) ABSTRACT

A container comprising a base portion, the base portion having at least one side support; and at least one end support at each end of the base portion; and a flexible, resilient lid portion, the lid portion configured to be installed to the base portion utilizing the resilience in the lid portion for inserting each end of the lid portion into the at least one end support. Further, a method for installing a flexible, resilient lid to a container, the container comprising a base portion having a side support at each side of the container and an end support at each end of the base portion, the method including bending the lid by applying pressure to each end of the lid; aligning the lid with each end support; and releasing the lid, wherein the lid re-forms into a flat lid within the end supports.

14 Claims, 10 Drawing Sheets

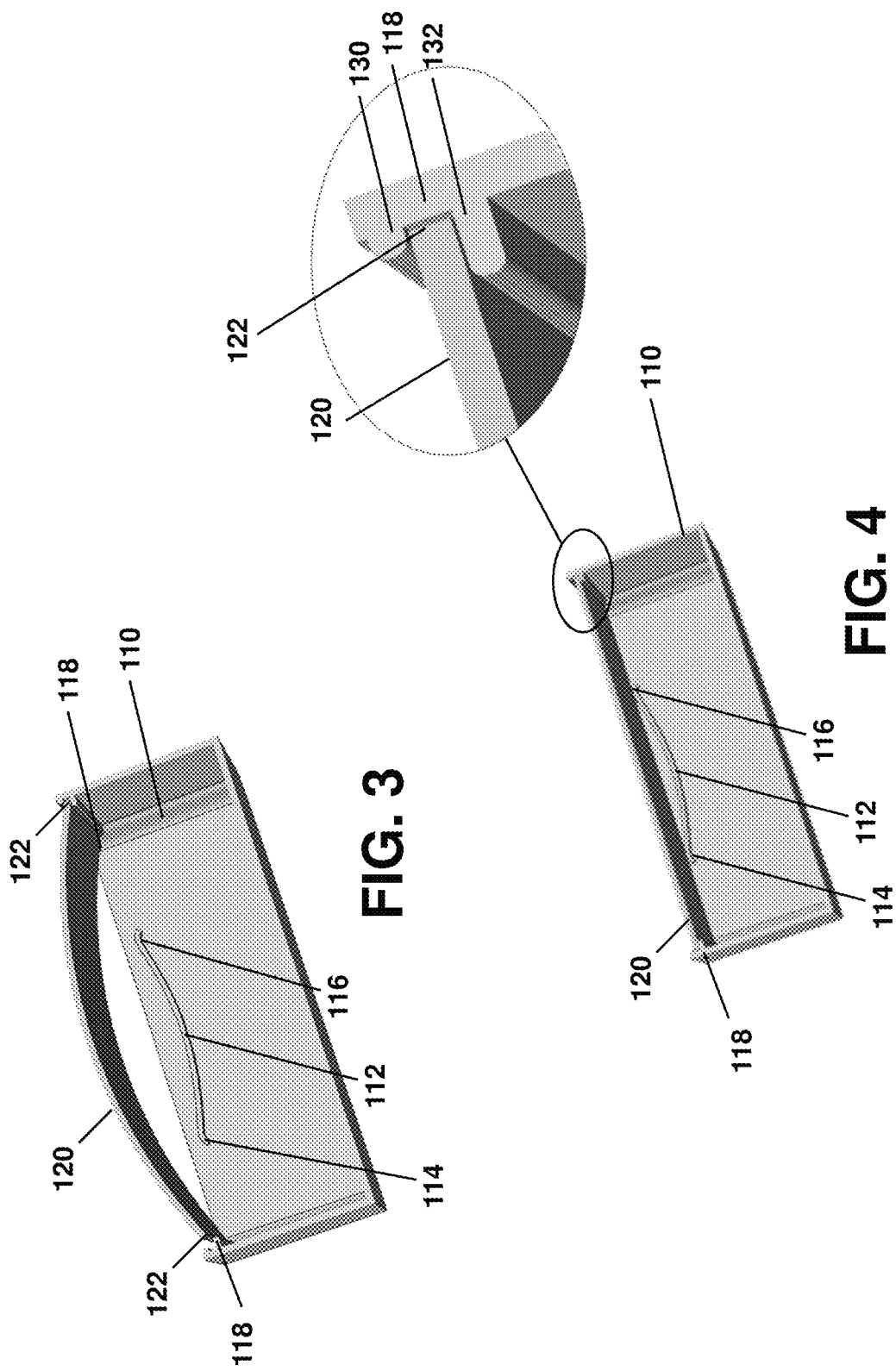

PUSH-TO-OPEN LID AND CONTAINER

FIELD OF THE DISCLOSURE

The present disclosure relates to containers, and in particular relates to lids for containers.

BACKGROUND

Containers may be used for a variety of purposes. In one example, printed circuit boards found within a product may need to be covered to protect the electronics and circuit board from impact and dust. In other cases, chips or components on a printed circuit board may be protected. In the past, this may have been done using shielding cans with snap on and peel off lids. In other cases, containers may be used to protect equipment. For example, often a building will put a case over a pull alarm to prevent the accidental engagement of the alarm. In other cases, the building may put a case over fire extinguishers or hoses.

However, many applications need occasional access to the inside of the container. This may be done with a lid that is screwed on, hinged, clasped, or otherwise secured to the base. Such screws, hinges, clasps or other securing mechanisms add cost to the container, and can use valuable space within the container, which may be an issue in some applications.

BRIEF DESCRIPTION OF THE DRAWINGS

The present disclosure will be better understood with reference to the drawings, in which:

FIG. 3 is a cross sectional view of a base portion and a lid portion while the lid portion is being installed.

FIG. 4 is a cross sectional view of a base portion and a lid portion after the lid portion has been installed.

DETAILED DESCRIPTION OF THE DRAWINGS

The present disclosure provides a container comprising: a base portion, the base portion having: at least one side support; and at least one end support at each end of the base portion; and a flexible, resilient lid portion, the lid portion configured to be installed to the base portion utilizing the resilience in the lid portion for inserting each end of the lid portion into the at least one end support.

The present disclosure further provides a container comprising: a base portion, the base portion having: a side support at each side of the container; and an end support at each end of the base portion; and a flexible, resilient lid portion, the lid portion configured to be installed to the base portion utilizing the resilience in the lid portion for inserting each end of the lid portion into a respective end support.

The present disclosure further provides a method for installing a flexible, resilient lid to a container, the container comprising a base portion having a side support at each side of the container and an end support at each end of the base portion, the method comprising: bending the lid by applying pressure to each end of the lid; aligning the lid with each end support; and releasing the lid, wherein the lid re-forms into a flat lid within the end supports.

Components under a cover or insider a container may need to occasional be accessed. For example, a cover may be placed over a printed circuit board or over the sensitive electronics within a commercial product to protect such electronics. However, in order to access the electronics within such cover, a lid for the cover may need to be removed.

Typically, covers for printed circuit boards include a lid that is secured to a base utilizing screws. However, such screws add a cost to the cover, both in terms of material costs and installation costs. Further, screws require screw bosses within the cover. The screw bosses take additional space away from the PCB and inside the product.

Other securing mechanisms, such as clasps, hinges, or the like further add material and installation costs.

In other embodiments, a protective casing may be placed around alarms or firefighting equipment. Such alarms or firefighting equipment may occasionally need to be serviced and the protective casing may make the equipment therein difficult to access.

In this regard, in accordance with the embodiments of the present disclosure a lid and base combination is provided which allows a simple, cost-effective solution to install and open the lid. The present disclosure is not limited to any particular use for a container. While the present disclosure is provided with regard to a container that can be mounted over a printed circuit board, the present disclosure is not limited to such functionality.

Figure 1:
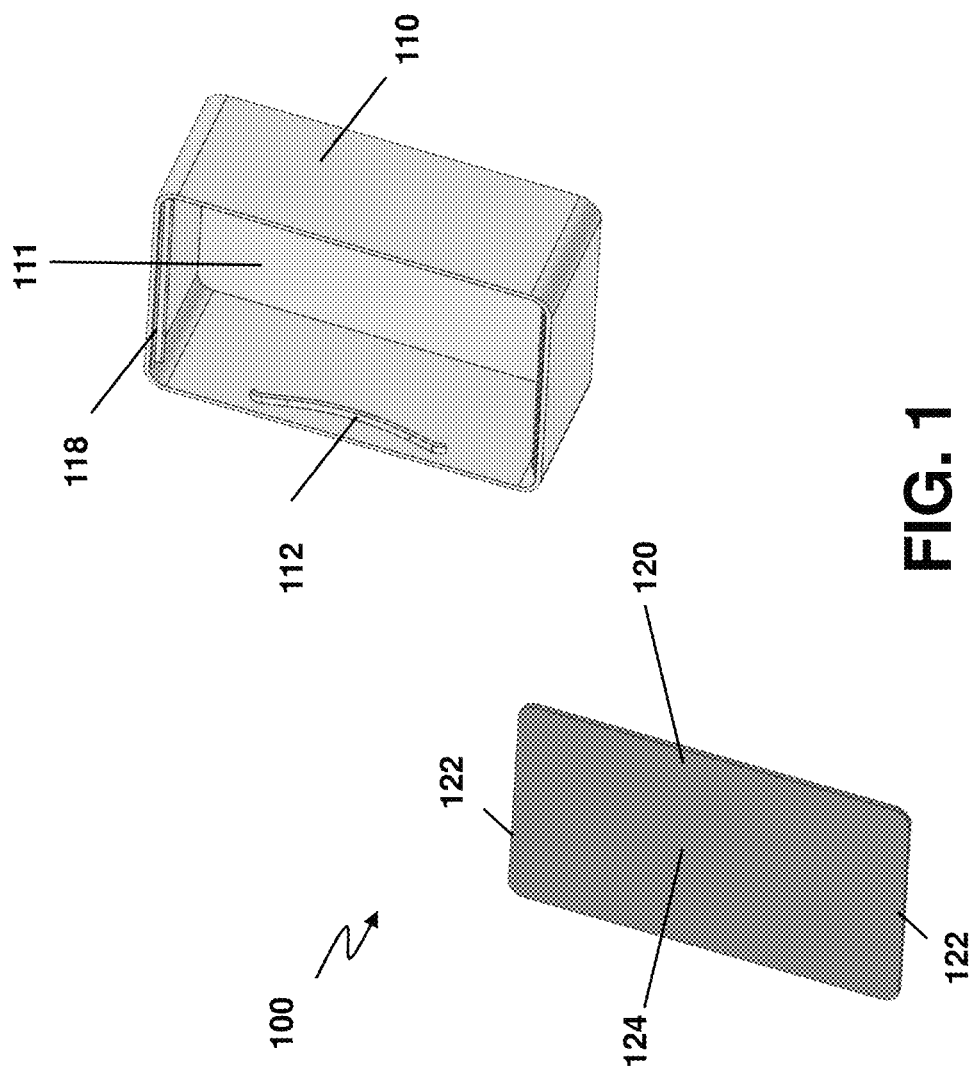
FIG. 1 is a perspective view of a base portion and a lid portion that may be used in accordance with the embodiments of the present disclosure.

Reference is now made to the drawings, in which like reference numerals are used throughout the drawing figures. As seen in FIG. 1, a container includes a base portion 110 and a lid portion 120.

Base portion 110 may be any container or cover for an application, and in this regard may be shaped and configured based on such application. In particular, base portion 110 may include a bottom 111 in some cases. However, in other cases where the base portion is mounted directly to the printed circuit board or to another container or surface, it may not require a bottom portion. Therefore, bottom portion 111 is optional.

In the example of FIG. 1, base portion 110 is substantially rectangular in shape. However, in other embodiments, different shapes could be used for base portion 110. For example, base portion 110 may have more than four sides. The embodiments of the present disclosure would equally work with, for example, a hexagon shaped base portion 110. In other cases, base portion 110 may have rounded ends. In other cases, base portion 110 may have more than four sides.

In the embodiments of the present disclosure, base portion 110 includes at least one side support member 112. Typically, base portion 110 would include two side support members 112, opposite each other. The side support members are described in more detail below.

Base portion 110 further includes an end support member 118 at each end thereof. End support member 118 is configured to allow installation of the lid portion 120 and to hold the lid portion to the base portion 110. The end support member 118 is described in more detail below.

The lid portion 120 is comprised of any flexible, resilient material that allows lid portion 120 to be bent with pressure at the ends 122 of the lid portion 120, and then to spring back to the substantially flat configuration once the pressure at ends 122 is removed.

Figure 2:
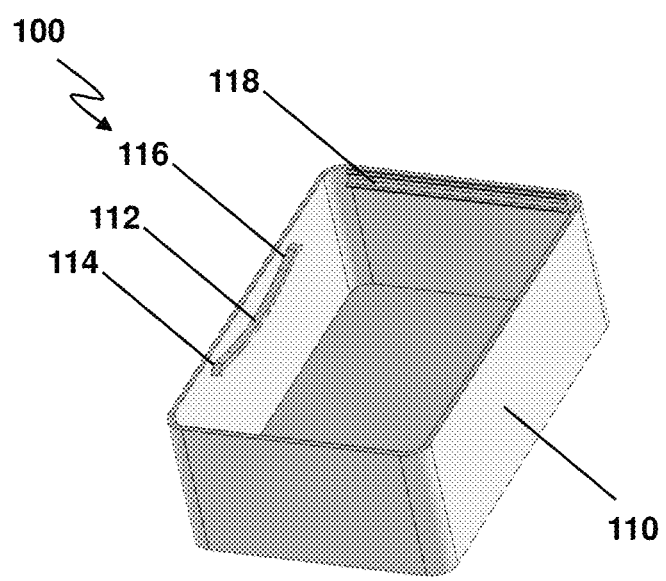
FIG. 2 is a perspective view of a base portion that may be used in accordance with the embodiments of the present disclosure.

Referring to FIG. 2, base portion 110 is provided. In the example of FIG. 2, end support member 118 includes a lower protrusion and upper protrusion.

Further, side support member 112 includes a raised surface 114 and a raised surface 116. In practice, the raised surface 114, raised surface 116 and the lower protrusion of end support member 118 are coplanar.

Further, side support member 112 extends downwardly into the base portion 110 from the raised surfaces 114 and 116 towards a middle of the side support member 112. This central dip can, in practice, provide support for when pressure is placed onto a central part 124 of the lid portion 120 to prevent the lid portion 120 from contacting the contents of base portion 110 or from warping the lid portion 120 too much, thereby potentially damaging lid portion 120.

Referring to FIGS. 3 and 4, installation of lid portion 120 may be accomplished by adding pressure to the ends 122 of lid portion 120 in order to bend the lid portion 120. As seen in FIG. 4, the end support member 118 includes a upper protrusion 130 and a lower protrusion 132. In this regard, for installation, the lid portion 120 must be bent sufficiently to allow the ends 122 to clear the upper protrusion 130 but still engage the lower protrusion 132. Thereafter, the lid may be released, as seen in FIG. 4, in which case the resilience of the lid portion 120 causes the lid to re-form into a substantially flat lid portion. In this case, the ends 122 of lid portion 120 fit between the upper protrusion 130 and the lower protrusion 132 at each end of the base, thereby holding the lid portion 122 in place. As such, the base portion 110 could be rotated, vibrated or displaced and the lid portion 122 would remain in place.

As seen in FIG. 4, when the lid portion 120 is in the substantially flat configuration, it may rest on the raised surfaces 114 and 116 on the sides, thereby providing support to the lid portion 120.

Figure 5:
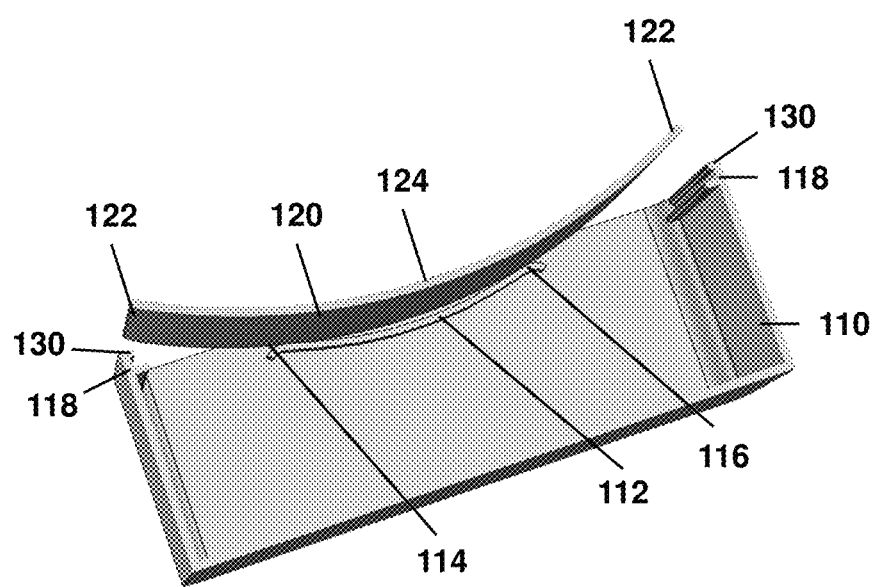
FIG. 5 is a cross sectional view of a base portion and a lid portion while the lid portion is being removed.

Referring to FIG. 5, in order to remove the lid portion 120, pressure may be applied to a central part 124 of the lid portion 120. In this regard, side support member 112 is configured to allow for the lid portion 120 to bend sufficiently to allow the ends 122 to clear the upper protrusion 130 on at least one end of the base portion 110. Specifically, the spacing between the raised surfaces 114 and 116, as well as the depth of the dip in the side portion 112 may be configured to allow for the lid portion 120 to have sufficient bend to clear such upper protrusion 130 when pressure is applied to central part 124 of lid portion 120.

Once the lid portion 120 is bent and at least one of the end portions 122 has cleared the upper protrusion 130, the lid may be removed from the base portion 110, thereby allowing access to the contents of a base portion 110.

Figure 6:
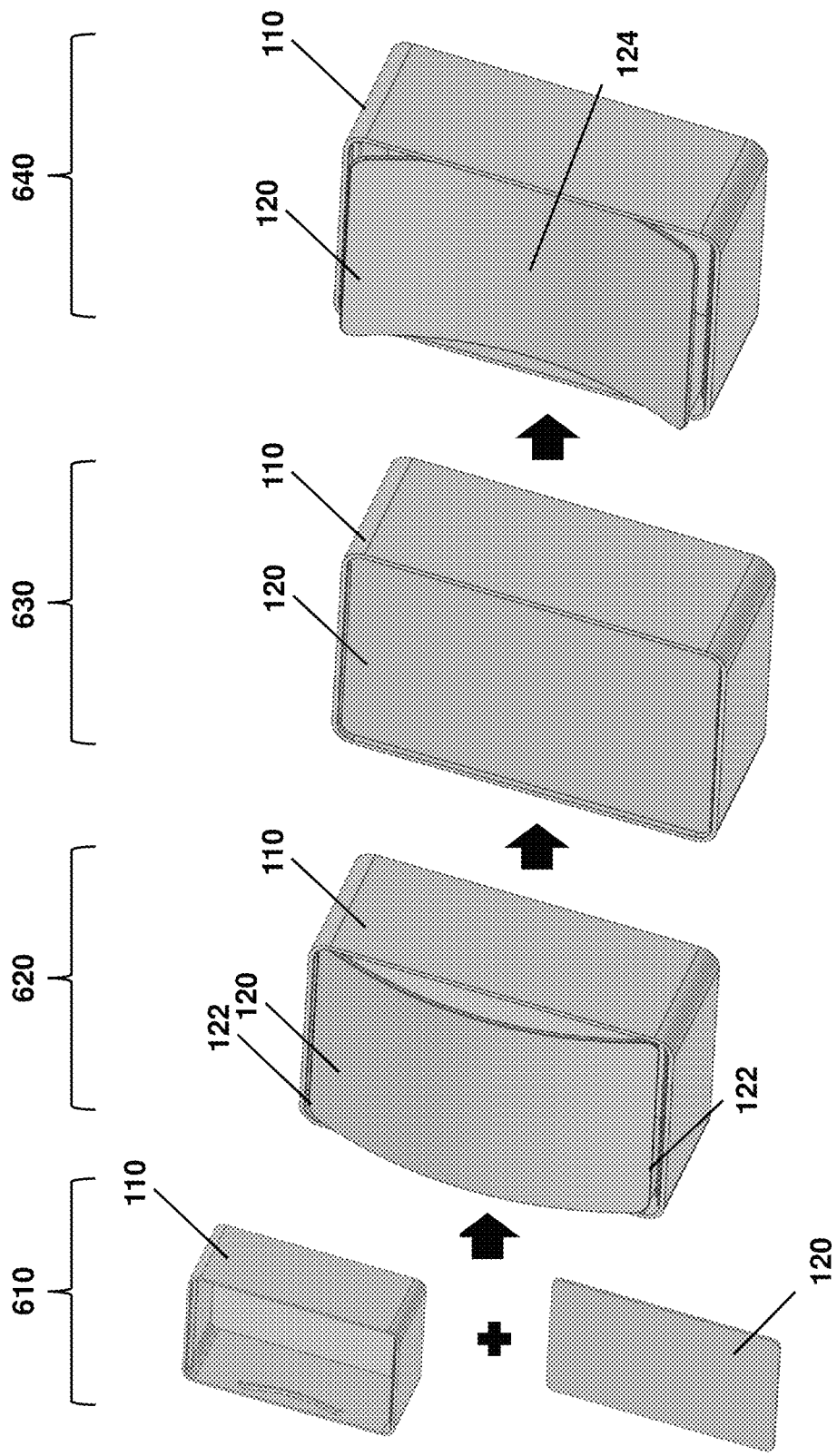
FIG. 6 is a perspective view of a base portion and lid portion in various stages of installing and removing the lid portion.

Reference is now made to FIG. 6, which shows the process for the installation and removal of the lid portion 120 onto the base portion and from the base portion 110. Specifically, as seen in FIG. 6, at a first stage 610, the lid portion 120 is separate from the base of a portion 110. Pressure may be applied to each end of lid portion 120 as seen in second stage 620 in order to situate the lid in the appropriate position for engagement with the end support member 118.

The pressure may then be released as seen at stage 630, where the container is closed and the lid portion 120 is secured to the base portion 110. In particular, the resilience of lid portion 120 causes the lid portion 120 to assume a substantially flat shape and engage the end supports of the base portion 110. Further, support for the sides of the lid portion 120 may be accomplished through one or more side supports.

In this regard, installation may be accomplished without use of any mechanical fasteners being added to the lid. An assembler does not need to screw lid portion 120 to base portion 110, saving costs in both materials and installation time.

Thereafter, as seen at stage 640, pressure may be applied to a central part 124 of the lid portion 120 in order to bend the lid portion 120 and disengage from the end members 118. Thereafter, the lid may be removed from the base portion 110 to allow access to the contents within the base portion 110.

While the embodiments of FIGS. 1 to 5 show a side support 112 having raised surfaces 114 and 116 as well as a central part that dips from the raised surfaces 114 and 116, other options are possible.

Figure 7:
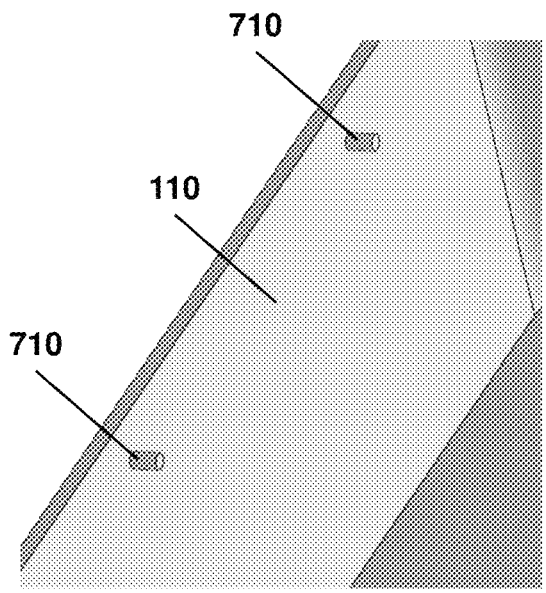
FIG. 7 is a perspective view a portion of a side of a base portion having alternative side supports.

In particular, reference is now made to FIG. 7. In the embodiment of FIG. 7, rather than a side portion 112, pegs 710 may be provided on one or both sides of a base portion 110. Pegs 710 may be located on the same plane as the base of the end support 118 and provide for support for the lid portion 120 once the lid portion 120 is in its flat, closed configuration. In the example of FIG. 7, pegs 710 may protrude sufficiently to provide support without impinging too much into base portion 110.

Figure 8:
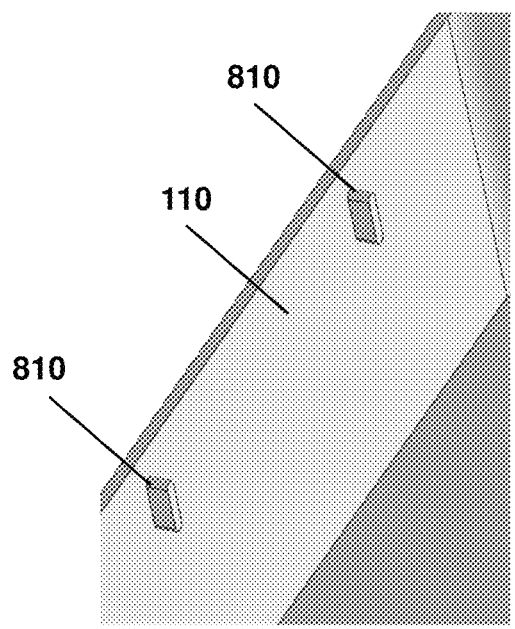
FIG. 8 is a perspective view a portion of a side of a base portion having alternative side supports.
Figure 9:
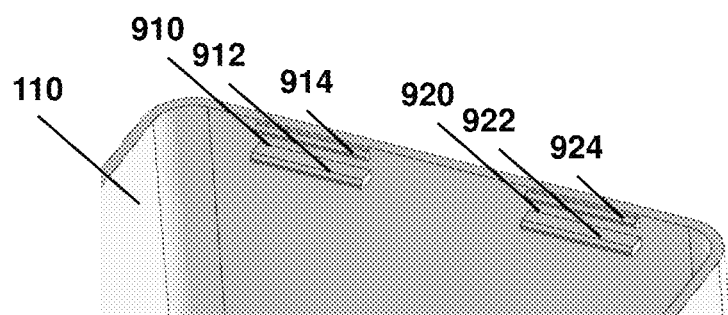
FIG. 9 is a perspective view a portion of an end of a base portion having alternative end support protrusions.

Another option is provided with regard to FIG. 8. In particular, in FIG. 8, pegs 810 may be provided at one or both sides of the base portion 110. Pegs 810 are configured differently from pegs 710 of FIG. 7. Specifically, pegs 810 are elongate, which may provide more structure to such pegs, thereby avoiding the peg from breaking away from base portion 110 in some embodiments.

While the embodiments of FIGS. 7 and 8 provide an alternative to side support 112, this is not meant to be limiting. Other types of supports could equally be used with the embodiments of the present disclosure. In particular, any supports in which the pegs or side supports are spaced sufficiently apart from each other to allow for the lid portion 120 to be bent along a central part 124 into the container for removal of the lid portion would be suitable. Further, such pegs may provide a pivot point for the lid portion to ensure the disengagement of the lid portion from the end supports.

Further, in some embodiments, fewer or more supports could be provided at the sides. Specifically, in some cases it may be sufficient to have only one peg or side support on one side or both sides of the base portion 110. If only one side support exists on a side of the base portion, typically such support would be displaced away from the central part 124 of the lid portion 120 to allow such lid portion to be bent.

Further, in some embodiments, a different number of supports or different configuration of supports could be used on the sides of base portion 110. Specifically, in some cases the side support 112 could be used on a first side of the base portion 110 and pegs such as those described with regard to FIGS. 7 and 8 could be used on a second side of the base portion 110. In other cases, a single peg may be used on one side of the base portion 110 and two or more pegs could be used on a second side of the base portion 110. Other options are possible.

In addition to the side supports, the end supports may also vary. Reference is now made to FIGS. 9 to 15.

In some embodiments, the end supports may be broken at an end of base portion 110. For example, in the embodiment of FIG. 9, an end of base portion 110 may include a first end support 910 and a second and support 920. The first end support 910 includes an upper protrusion 912 and a lower protrusion 914. Second end support 920 includes an upper protrusion 922 and a lower protrusion 924. While the embodiment of FIG. 9 includes only two end supports, in other embodiments, a plurality of end supports could be provided along an end of base portion 110.

Figure 10:
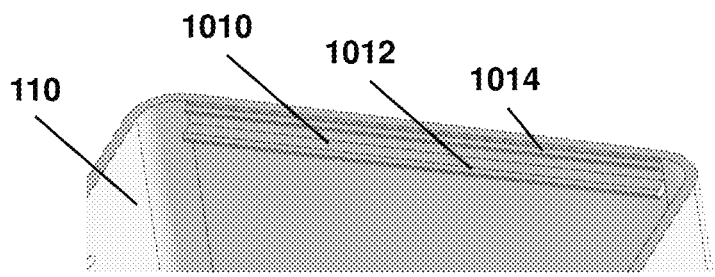
FIG. 10 is a perspective view a portion of an end of a base portion having alternative end support protrusions.

Referring to FIG. 10, a single end support 1010 can extend along an end of base portion 110. End support 1010 can include an upper protrusion 1012 and a lower protrusion 1014. In some embodiments, end support 1010 can extend along an entire end of base support 110. In other cases, the end support 1010 could be shorter. In some cases, base support 1010 is centred between the sides and along an end of a base portion 110.

Figure 11:
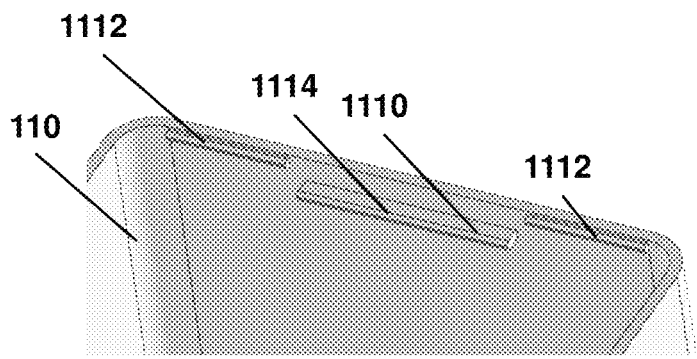
FIG. 11 is a perspective view a portion of an end of a base portion having alternative end support protrusions.

Referring to a FIG. 11, an end support 1110 could include a plurality of upper protrusions 1112 and a single lower protrusion 1114, where the upper protrusions 1112 and the lower protrusion 1114 are staggered along the end of base portion 110. In other cases, a single upper protrusion 1110 and a plurality of lower protrusions 1114 could exist. In other cases, both a plurality of upper protrusions 1112 and a plurality of lower protrusions 1114 could exist along an end of base portion 110.

Figure 12:
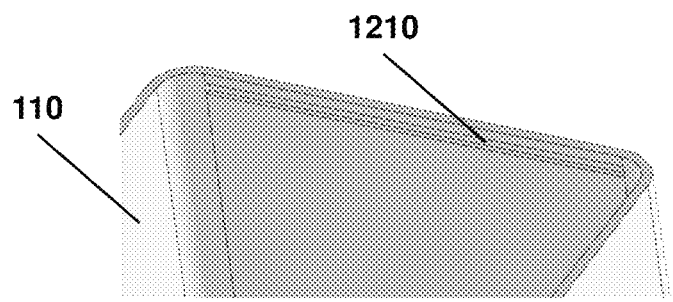
FIG. 12 is a perspective view a portion of an end of a base portion having an end support slot.
Figure 13:
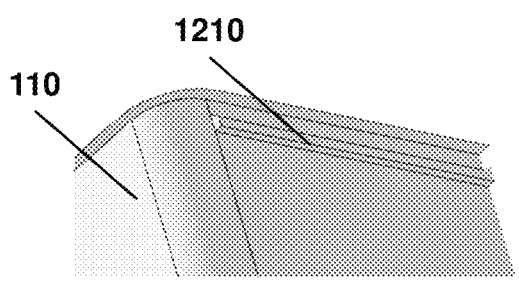
FIG. 13 is a cut away of the perspective view of FIG. 12.

Referring to FIGS. 12 and 13, rather than protrusions, a slot may exist within an end of base portion 110. In particular, FIG. 13 is a cutaway portion of the embodiment of FIG. 12 and shows an indent or slot in an end of base portion 110. Slot 1210 could accommodate an end of lid portion 120. In particular, slot 1210 may, in some embodiments, extend the length of the end of the base portion 110, thereby allowing a lid portion 120 to fit therein.

In other embodiments, the slot 1210 may be shorter than the end of the base portion 110, in which case the lid portion 120 may be configured to have an end 122 dimensioned to fit within the slot 1210. This may involve, for example, cutting away the corners of lid portion 120 to allow the ends of lid portion 120 to fit within slot 1210.

Figure 14:
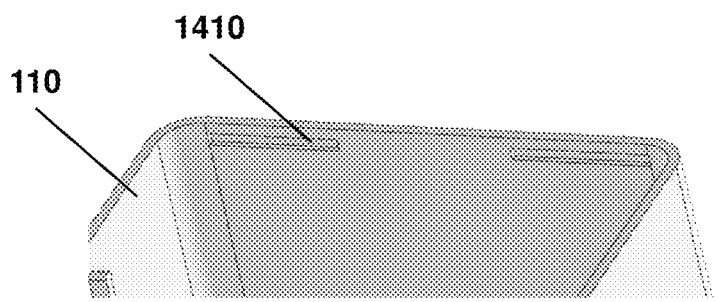
FIG. 14 is a perspective view a portion of an end of a base portion having alternative end support slots.
Figure 15:
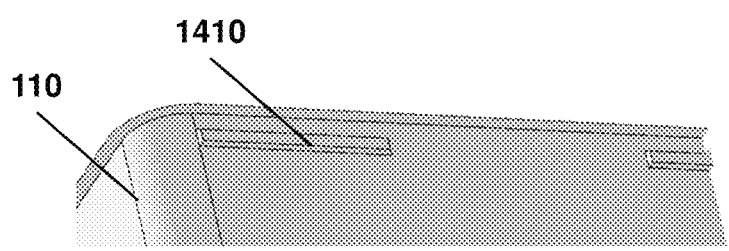
FIG. 15 is a cut away of the perspective view of FIG. 14.

Referring to FIGS. 14 and 15, in some embodiments a plurality of slots 1410 may exist in an end of base portion 110. The embodiment of FIG. 15 is a cutaway of the embodiment of FIG. 14 showing a cutaway of one slot 1410.

While the embodiments of FIGS. 14 and 15 show two slots 1410, in other embodiments more slots may be provided at the end of base portion 110.

Lid portion 120 would have an end 122 dimensioned to fit within the slots 1410 at each end of the base portion 110.

Further, in some embodiments, the end portions described with regard to FIGS. 9 to 15 could be combined. Specifically, in some cases, a first end of base portion 110 could have protrusions or slots as described with regard to FIGS. 9 to 15, and a second end of base portion 110 could have different protrusions or slots as described with regard to FIGS. 9 to 15.

In practice, the base portion 110 and lid portion 120 may be standalone containers, or may fit within another product. For example, referring to FIG. 16, a container 1610 may be used for mounting electronics and components to a shipping container. A base portion 110 may be used to house a printed circuit board and electronics and a lid portion 120 may fit thereon. Other parts of container 1610 may be used for other components such as sensors, input and output devices, or other such components.

Figure 16:
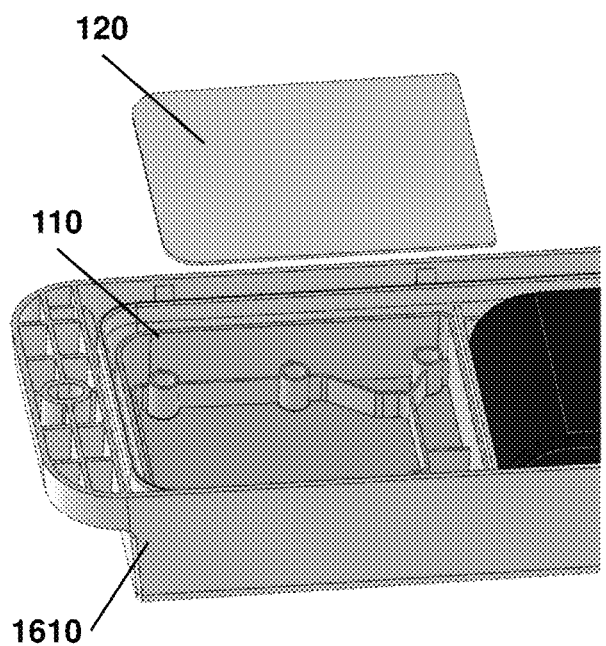
FIG. 16 is a perspective view of a container capable of housing the base portion and lid portion of the embodiments of the present disclosure.

Therefore, the embodiment of FIG. 16 shows one case in which the base and lid portions of the present disclosure may be utilized. However, as would be appreciated by those skilled in the art, the base portion 110 and lid portion 120 could be used in many other scenarios.

Based on the embodiments of FIGS. 1 to 16, a push to open lid and base are provided which allow for easy, cost effective closing of the base portion while allowing for easy access subsequent to such closing to the contents of the base portion.

The embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

Also, techniques, systems, subsystems, and methods described and illustrated in the various implementations as discrete or separate may be combined or integrated with other systems, modules, techniques, or methods. Other items shown or discussed as coupled or directly coupled or communicating with each other may be indirectly coupled or communicating through some interface, device, or intermediate component, whether electrically, mechanically, or otherwise. Other examples of changes, substitutions, and alterations are ascertainable by one skilled in the art and may be made.

While the above detailed description has shown, described, and pointed out the fundamental novel features of the disclosure as applied to various implementations, it will be understood that various omissions, substitutions, and changes in the form and details of the system illustrated may be made by those skilled in the art.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

The invention claimed is:

1. A container comprising:
   a base portion comprising at least two sides and two ends, the base portion having:
      at least one side support, wherein the at least one side support comprises:
         a first raised support connected to an inner part of the base portion;

a second raised support connected to the inner part of the base portion; and a central portion displaced further away from an opening of the based portion than the first raised support and the second raised support; and one end support at each end of the base portion, wherein each end support comprises at least one upper protrusion and at least one lower protrusion; and a flexible, resilient lid portion comprising two ends, the lid portion configured to be installed to the base portion utilizing the resilience in the lid portion for inserting each end of the lid portion into a corresponding end support;

wherein the first raised support and the second raised support are coplanar with the at least one lower protrusion.

2. The container of claim 1, wherein the central portion prevents a central part of the lid from being pushed further into the base portion than the central portion when disengaging the lid portion.

3. The container of claim 1, wherein the at least one side support comprises a pair of pegs protruding into the base portion.

4. The container of claim 3, wherein the pair of pegs is spaced to allow a central part of the lid portion to flex therebetween.

5. The container of claim 1, wherein the at least one lower protrusion extends into the base portion more than the at least one upper protrusion.

6. The container of claim 1, wherein the at least one upper protrusion is staggered from the at least one lower protrusion at an end of the base portion.

7. The container of claim 1, wherein each end support comprises at least one slot at the end of the base portion.

8. The container of claim 1, wherein a first end support on one end of the base portion differs from a second end support at a second end of the base portion.

9. A container comprising:
a base portion comprising at least two sides and two ends, the base portion having:
a side support at each side of the base portion, wherein each side support comprises:
a first raised support connected to an inner part of the base portion;
a second raised support connected to the inner part of the base portion; and
a central portion displaced further away from an opening of the base portion than the first raised support and the second raised support; and
an end support at each end of the base portion, wherein each end support comprises at least one upper protrusion and at least one lower protrusion; and
a flexible, resilient lid portion comprising two ends, the lid portion configured to be installed to the base portion utilizing the resilience in the lid portion for inserting each end of the lid portion into a respective end support;
wherein the first raised support and the second raised support are coplanar with the at least one lower protrusion.

10. The container of claim 9, wherein the central portion prevents a central part of the lid from being pushed further into the base portion than the central portion when disengaging the lid portion.

11. The container of claim 9, wherein each side support comprises a pair of pegs protruding into the base portion.

12. The container of claim 11, wherein the pair of pegs is spaced to allow a central part of the lid portion to flex therebetween.

13. The container of claim 9, wherein the at least one lower protrusion extends into the base portion more than the at least one upper protrusion.

14. The container of claim 1, wherein a first side support on one side of the base portion differs from a second side support at a second side of the base portion.

\* \* \* \* \*